United States Patent
Gustafsson et al.

(10) Patent No.: US 9,019,015 B2
(45) Date of Patent: Apr. 28, 2015

(54) WIDEBAND AND RECONFIGURABLE DOHERTY BASED AMPLIFIER

(75) Inventors: David Gustafsson, Göteborg (SE); Christian Fager, Göteborg (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 78 days.

(21) Appl. No.: 14/009,163

(22) PCT Filed: May 5, 2011

(86) PCT No.: PCT/EP2011/057182
§ 371 (c)(1),
(2), (4) Date: Oct. 1, 2013

(87) PCT Pub. No.: WO2012/149976
PCT Pub. Date: Nov. 8, 2012

(65) Prior Publication Data
US 2014/0035682 A1    Feb. 6, 2014

(51) Int. Cl.
*H03F 1/02* (2006.01)
(52) U.S. Cl.
CPC ............... *H03F 1/0288* (2013.01); *Y02B 60/50* (2013.01)

(58) Field of Classification Search
USPC .......................... 330/295, 124 R, 286, 53, 84
See application file for complete search history.

(56) References Cited

U.S. PATENT DOCUMENTS 7,248,108 B2 * 7/2007 Fratti ........................ 330/124 R
2009/0051438 A1   2/2009 Okubo et al.

* cited by examiner

*Primary Examiner* — Hieu Nguyen
(74) *Attorney, Agent, or Firm* — Coats & Bennett, P.L.L.C.

(57) ABSTRACT

The present disclosure provides a power amplifier comprising a main amplifier and an auxiliary amplifier. The power amplifier is configured to deliver an output power $P_{out}$. A First Efficiency Peak (FEP) is defined as a first efficiency peak in the power ratio $P_{out}$ to $P_{outmax}$. $P_{outmax}$ is a maximum power output of the power amplifier and $P_{FEP}$ defines a power ratio at the FEP. The main amplifier is configured to be biased by a main amplifier bias $V_{ds,m}$ that is substantially equal to an auxiliary amplifier bias $V_{ds,a}$ times $x_b$ with $x_b$ being a main amplifier output current in relation to the maximum current through the main amplifier when $P_{out}$ equals $P_{FEP}$. The impedances of a load and a main amplifier transmission line are arranged to be substantially equal. A corresponding method and a node in a wireless communication system comprising the power amplifier are also disclosed.

15 Claims, 7 Drawing Sheets

WIDEBAND AND RECONFIGURABLE DOHERTY BASED AMPLIFIER

TECHNICAL FIELD

The present invention relates to the field of microwave power amplifiers for use in electronic systems, e.g. in radio base stations (RBS) used in wireless communication systems.

BACKGROUND

The efficiency of radio and microwave power amplifiers (PA) constantly needs to be improved to reduce their power consumption. The telecom industry energy consumption is estimated to account for approximately 1 percent of the yearly global energy consumption of the planet, and a large share of this energy consumption is assigned to radio base stations (RBS). It is therefore important with high efficiency Power Amplifiers. Within the RBS, more than 80% of the energy consumption is related to radio equipment, amplifiers and cooling systems, a figure that can be reduced by increased power amplifier efficiency.

In modern communication standards, such as 3G, 4G, LTE, WiMax etc, the desired output signal has a high peak to average ratio (PAR) of typically 7-10 dB. To obtain high average efficiency for Power Amplifiers operating in such systems, the efficiency of the PA must remain high also below the peak output power. A variety of amplifier and transmitter topologies have been proposed to address this problem. One of the most popular and high performing topologies is the Doherty amplifier.

Furthermore, the increasing number of frequency bands and spectrum fragmentation in modern communication systems require Power Amplifiers with broadband capabilities. However, it has turned out to be very difficult to design Power Amplifiers with both broadband capabilities and high average efficiency at the same time.

When realizing a Doherty amplifier, there are today two main techniques that are used.

The first technique is to drive the amplifier with a single RF-input, as originally proposed by Doherty. To obtain the correct load modulation the main amplifier is typically biased in class AB or class B while the auxiliary amplifier is biased in class C. This gives a simple topology but the linearity and efficiency as well as the power utilization factor (PUF) of the amplifier are deteriorated compared to the theoretical limit of the Doherty amplifier. Class A, B, AB and C amplifiers are well known to the skilled person and therefore not further discussed here.

The second technique is to use dual RF-inputs, where each RF-signal is modulated independently. This allows the transistors in the amplifiers to be biased in class B and thereby, in theory, the possibility to obtain ideal Doherty characteristics. Although this technique requires more complex signal processing and two RF input signal paths it is popular due to the good Doherty characteristics achievable.

The topology of an ideal Doherty amplifier is schematically depicted in FIG. 1, where ideal current sources represent main and auxiliary amplifiers. Throughout the description and claims, the current values given refer to the amplitude of the fundamental frequency, if nothing else is stated. The fundamental frequency is defined as the lowest frequency of a periodic waveform. Also, all harmonic frequencies are assumed to be short circuited throughout the description and claims. The values of a load impedance, $Z_L$, a main amplifier transmission line characteristic impedance, $Z_c$, a drain-source bias, $V_{ds}$, and amplifier fundamental frequency RF output current amplitudes, $I_a$ for the auxiliary amplifier and $I_m$, for the main amplifier for proper operation are given in Table 1 below.

TABLE 1

Basic ideal Doherty amplifier load impedance, transmission line characteristic impedance, drain-source bias and amplifier output currents.

$$V_{ds,a} = V_{ds,m} \quad (1)$$
$$Z_L = x_b V_{ds,a}/I_{max,m} \quad (2)$$
$$Z_c = V_{ds,a}/I_{max,m} \quad (3)$$
$$I_m = \overline{I_m} I_{max,m} \quad 0 < \overline{I_m} < 1 \quad (4)$$

$$I_a = \begin{cases} 0, & 0 \le \overline{I_m} \le x_b \\ kI_{max,m}(\overline{I_m} - x_b)e^{i\theta}, & x_b < \overline{I_m} \le 1 \end{cases} \quad (5)$$

$$\theta = \pi \overline{f}/2 \quad (6)$$

$$k = \frac{1}{x_b} \quad (7)$$

$I_{max,m}$ is the maximum main amplifier output current amplitude at the fundamental frequency, $V_{ds}$ is the drain-source bias and $\overline{I_m}$ and $\overline{I_a}$ is the normalized main and auxiliary amplifier output current amplitude at the fundamental frequency, respectively. Added subscript m or a, refers to the main and auxiliary amplifiers, respectively.

$I_m$ is henceforth, unless otherwise stated, called the main amplifier output current and $I_a$ is henceforth, unless otherwise stated, called the auxiliary amplifier output current. θ is the phase difference, expressed in radians, between the auxiliary amplifier output current $I_a$ and the main amplifier output current $I_m$. Table 1 is adapted for transistors of FET-type (Field Effect Transistors) having gate, drain and source terminals. Designations and terms are thus adapted for FET transistors. These terms and designations are however also valid for transistors using base, collector and emitter terminals, i.e. with base corresponding to gate, collector to drain and emitter to source. Some examples; whenever drain-source is mentioned it is also valid for collector-emitter and whenever drain-source bias or drain-source voltage is used it is also valid for collector-emitter bias or collector-emitter voltage and when gate biasing is mentioned it is also valid for base biasing. All examples mentioned are thus also valid for corresponding examples using transistors with base, emitter and collector terminals.

For a given technology certain design rules apply. In this case the values of the drain-source bias $V_{ds,i}$, the load impedance $Z_L$, and the main amplifier transmission line characteristic impedance $Z_c$ must be chosen to fulfill $I_{peak,i} \le I_{sat,i}$ and $V_{peak,i} \le V_{b,i}$, where $I_{peak,i}$ is the amplifier peak output current, $I_{sat,i}$ is the amplifier saturation output current, $V_{peak,i}$ is the maximum amplifier output voltage and $V_{b,i}$ is the amplifier break down voltage. Note that $I_{peak,i}$, $I_{sat,i}$, $V_{peak,i}$ and $V_{b,i}$ all refer to time domain peak values including fundamental and harmonic frequencies as well as possible DC current. The subscript i refers to the main or auxiliary amplifier. These design rules are well known for the design of amplifiers and thus well known to the skilled person. As the subscript i refers to the main or auxiliary amplifier, it means that the current and voltage restrictions are valid for both the main amplifier and the auxiliary amplifier. $I_{max,m}$ is the maximum main amplifier output current amplitude at the fundamental frequency. Both amplifiers are arranged to operate over a bandwidth B with a centre frequency $f_0$ where $\overline{f}$ is the normalized frequency, defined as the frequency divided with the centre frequency $f_0$. The parameters $x_b$ and k will be described in association with FIG. 2. The definitions of the ideal Doherty amplifier according to table 1 is well known to the skilled person and can e.g. be found in "RF Power Amplifiers for Wireless Communication" by Cripps, Steve C, second edition, Chapter 10. Henceforth an ideal Doherty amplifier is called a Doherty amplifier unless otherwise stated.

FIG. 1 shows a power amplifier 100 comprising the main amplifier 101 and the auxiliary amplifier 102, each amplifier, in FIG. 1 represented with an ideal current source connected to a ground 104 at a first end and delivering an output current at a second end. The amplifiers are arranged to receive an input signal each and to operate in parallel and at an output end 105 both being connected to one end of a load having an impedance $Z_L$ the other end of which is connected to the ground 104. Both amplifiers are, as mentioned above, arranged to operate over a bandwidth B with a centre frequency $f_0$. The main amplifier 101 is arranged to generate the main amplifier output current $I_m$ and is connected to the load with the impedance $Z_L$ via a main amplifier transmission line 103 with the characteristic impedance $Z_c$. The load with the impedance $Z_L$ is henceforth, unless otherwise stated, called the load $Z_L$. The main amplifier transmission line has an electrical length of a quarter of a wavelength at the centre frequency $f_0$ and has an output impedance $Z_{m2}$ towards the load $Z_L$ and an input impedance of $Z_{m1}$ to the main amplifier transmission line 103. The auxiliary amplifier 102 is arranged to generate the auxiliary amplifier output current $I_a$ and is connected to the load $Z_L$ as described. The main amplifier is arranged to operate with a drain-source break down voltage $V_{b,m}$ and with a drain-source bias $V_{ds,m}$. The auxiliary amplifier is arranged to operate with a drain-source break down voltage $V_{b,a}$ and with a drain-source bias $V_{ds,a}$. The power amplifier is arranged to deliver an output power $P_{out}$, and the auxiliary amplifier output current $I_a$ is arranged to be set to zero below a First Efficiency Peak, FEP. The FEP is defined as the first efficiency peak in the power ratio $P_{out}$ to $P_{out,max}$. $P_{out,max}$ is the maximum power output of the power amplifier and $P_{FEP}$ defines the power ratio at the First Efficiency Peak. All harmonic frequencies are assumed to be short circuited.

FIG. 2 shows how the efficiency depends on output power at the centre frequency $f_0$ for a class B biased Doherty amplifier. The efficiency is defined as a ratio between the output power $P_{out}$ of the power amplifier and the supplied DC power to the power amplifier. The ratio $P_{out}/P_{out,max}$, where $P_{out,max}$ is the maximum output power from the power amplifier, at the first efficiency peak (FEP), referred to as $P_{FEP}$ (see FIG. 2) and often expressed in dB below $P_{out,max}$, is a design parameter that sets a condition on the load impedance $Z_L$ as given by equation (2) where $x_b = 10^{P_{FEP}/20}$. $x_b$ can be seen as a transformation of a logarithmic $P_{FEP}$ value to a current amplitude being defined as a normalized main amplifier fundamental frequency output current amplitude $\overline{I_m}$, henceforth called the normalized main amplifier output current, at $P_{FEP}$. The normalized main amplifier output current $\overline{I_m}$ is defined as $I_m$ in relation to a maximum current through the main amplifier, $I_{max,m}$, see equation (4) where $I_{max,m}$ is the maximum main amplifier output current amplitude at the fundamental frequency. k is the inverse of $x_b$. The ratio $P_{out}/P_{out,max}$ is defined as the normalized output power of the power amplifier. The normalized auxiliary amplifier output current $\overline{I_a}$ is defined as $I_a$ in relation to the maximum current through the main amplifier, $I_{max,m}$.

In FIG. 2 the efficiency in percentage, depicted on the y-axis 202, is illustrated with a graph 204 as a function of the ratio $P_{out}/P_{out,max}$, shown on the x-axis 201 in dB below $P_{out,max}$. $P_{FEP}$ is shown as the FEP, 205 in the graph 204. How to choose $P_{FEP}$ depends on the signal probability density function, and typically, $P_{FEP}$ should approximately be equal to or slightly below the signal Peak to Average (PAR) value.

The transmission line on the output of the main amplifier transforms $Z_{m2}$ to $Z_{m1}$ according to equation (8):

$$Z_{m1}(\overline{f}) = Z_c \frac{Z_{m2} + jZ_c \tan\left(\frac{\overline{f}\pi}{2}\right)}{Z_c + jZ_{m2} \tan\left(\frac{\overline{f}\pi}{2}\right)} \quad (8)$$

where $\overline{f}$ is the normalized frequency, defined as the frequency divided with the centre frequency $f_0$. This formula for impedance transformation is well known to the skilled person and therefore not further discussed here.

Clearly $Z_{m1}$ is frequency dependent unless $Z_{m2}$ is equal to $Z_c$, which only is the case at $P_{out,max}$. This frequency dependency is a major reason to the often reported small bandwidth of the Doherty amplifier, i.e. when component values, currents and voltages are dimensioned according to Table 1. The bandwidth limitation of the Doherty amplifier has been examined and it has been shown that the efficiency has a strong frequency dependency at $P_{FEP}$ while the efficiency is independent of frequency at $P_{out,max}$. This is illustrated in FIG. 3 showing efficiency in percentage on the y-axis 302 versus output power as the ratio $P_{out}/P_{out,max}$ on the x-axis 301 in dB below $P_{out,max}$ for a Doherty amplifier with $x_b=0.5$. The Doherty amplifier is dimensioned with values calculated according to Table 1 and is class B biased, for both the main and auxiliary amplifier with optimal performance at the center frequency $f_0$. The efficiency versus output power for a typical standard amplifier dimensioned and biased as described above and with Doherty topology is plotted as three graphs 303-305 for a range of frequencies. The first graph 303 represents the centre frequency $f_0$, the second graph 304 frequencies at 0.8 f0 and 1.2 f0 and the third graph 305 frequencies 0.6 $f_0$ and 1.4 $f_0$. The $P_{out,max}$ value is marked at a point 306 in FIG. 3. The Output Power Back-Off (OPBO) is the amount of back-off from this maximum power output. The OPBO is a consequence of the required amplitude modulation of the transmitted signal. OPBO is defined as the ratio $P_{out}$ to $P_{out,max}$ and is often expressed in decibels (dB) below $P_{out,max}$. The strong frequency dependency in power back off is evident from the graphs in FIG. 3 and as frequency deviates from $f_0$ the efficiency curve degrades to regular class B amplifier efficiency behavior which is substantially below the optimal performance of a class B biased Doherty amplifier, as illustrated with the second graph 304 and the third graph 305 showing substantially less efficiency than the first graph 303.

It is important to note the $x_b$ dependency in equation (2) which implies that, in order to reconfigure $P_{FEP}$, $Z_L$, must be adjustable. Although this is highly desirable, it will require a tuneable matching network using e.g. varactor technology. In most practical implementations, this therefore makes $P_{FEP}$ a fixed parameter which limits the potential of using the Doherty amplifier in reconfigurable multi-standard applications.

The deterioration of efficiency in OPBO at frequencies outside the design frequency, typically being the centre frequency $f_0$, and the lack of reconfigurable $P_{FEP}$ are both great drawbacks of the Doherty amplifier, dimensioned according to Table 1, in times when wideband/multi standard devices are highly requested.

There is thus a need for an improved power amplifier with both broadband capabilities and high average efficiency at the same time, preferably also with a possibility to conveniently reconfigure $P_{FEP}$.

SUMMARY

The object of the invention is to reduce at least some of the mentioned deficiencies with the prior art solutions and to provide:
 a power amplifier and
 a method for power amplification
to solve the problem to achieve a power amplifier and method for power amplification with broadband capabilities and high average efficiency at the same time and preferably also with a possibility to conveniently reconfigure $P_{FEP}$.

The object is achieved by a power amplifier comprising a main amplifier and an auxiliary amplifier, each arranged to receive an input signal and to operate in parallel and at an output end both being connected to a load $Z_L$. Both amplifiers are arranged to operate over a bandwidth B with a centre frequency $f_0$. The main amplifier is arranged to generate a main amplifier output current $I_m$ and being connected to the load $Z_L$ via a main amplifier transmission line having an input impedance of $Z_{m1}$ to the main amplifier transmission line. The main amplifier transmission line has a characteristic impedance Z. The auxiliary amplifier is arranged to generate an auxiliary amplifier output current $I_a$ and is connected to the load $Z_L$. The main amplifier is arranged to operate with a drain-source, or collector-emitter, bias $V_{ds,m}$ and the auxiliary amplifier is arranged to operate with a drain-source, or collector-emitter, bias $V_{ds,a}$. The power amplifier is arranged to deliver an output power $P_{out}$, and the auxiliary amplifier output current $I_a$ is arranged to be set to zero below a First Efficiency Peak, FEP. The FEP is defined as the first efficiency peak in the power ratio $P_{out}$ to $P_{out,max}$. $P_{out,max}$ is the maximum power output of the power amplifier and $P_{FEP}$ defines the power ratio at the FEP, wherein:
 the main amplifier is arranged to be biased by $V_{ds,m}$ being substantially equal to $V_{ds,a}$ times $x_b$, $x_b$ being the main amplifier output current $I_m$ in relation to the maximum current through the main amplifier, $I_{max,m}$, when $P_{out}=P_{FEP}$ and
 the impedances of the load $Z_L$ and the main amplifier transmission line 103 are both arranged to be substantially equal to $V_{ds,a}$ divided with $I_{max,m}$ making the input impedance $Z_{m1}$ to the main amplifier transmission line 103 independent of frequency below $P_{FEP}$,
thus making the efficiency independent of frequency below $P_{FEP}$.

The object is further achieved by a method for power amplification using a main amplifier and an auxiliary amplifier each receiving an input signal and operating in parallel and both being connected to a load $Z_L$ at an output end. Both amplifiers operates over a bandwidth B with a centre frequency $f_0$. The main amplifier generates a main amplifier output current $I_m$ and is connected to the load $Z_L$ via a main amplifier transmission line having an input impedance of $Z_{m1}$, to the main amplifier transmission line. The main amplifier transmission line has a characteristic impedance $Z_c$. The auxiliary amplifier generates an auxiliary amplifier output current $I_a$ and is connected to the load $Z_L$. The main amplifier operates with a drain-source, or collector-emitter, bias $V_{ds,m}$ and the auxiliary amplifier operates with a drain-source, or collector-emitter, bias $V_{ds,a}$. The power amplifier delivers an output power $P_{out}$. A First Efficiency Peak, FEP, is defined as the first efficiency peak in the power ratio $P_{out}$ to $P_{out,max}$. $P_{out,max}$ is the maximum power output of the power amplifier. $P_{FEP}$ defines the power ratio at the First Efficiency Peak, wherein following steps are performed:

biasing the auxiliary amplifier by adjusting the $V_{ds,a}$ for operation with selected transistor/transistors in the auxiliary amplifier,
 biasing the main amplifier by setting $V_{ds,m}$ substantially equal to $V_{ds,a}$ times $x_b$, $x_b$ being the main amplifier output current $I_m$ in relation to the maximum current through the main amplifier, $I_{max,m}$, when $P_{out}=P_{FEP}$,
 selecting the impedances of the load $Z_L$ and the main amplifier transmission line both to be substantially equal to $V_{ds,a}$ divided with $I_{max,m}$ making the input impedance $Z_{m1}$ to the main amplifier transmission line independent of frequency below $P_{FEP}$ and
 setting the auxiliary amplifier output current $I_a$ to zero below the FEP
thus making the efficiency independent of frequency below $P_{FEP}$.

The invention also provides a node in a wireless communication system comprising a power amplifier according to any one of claims 1-9.

Additional advantages are achieved by implementing one or several of the features of the dependent claims not mentioned above, as will be explained below.

DETAILED DESCRIPTION

Figure 1:
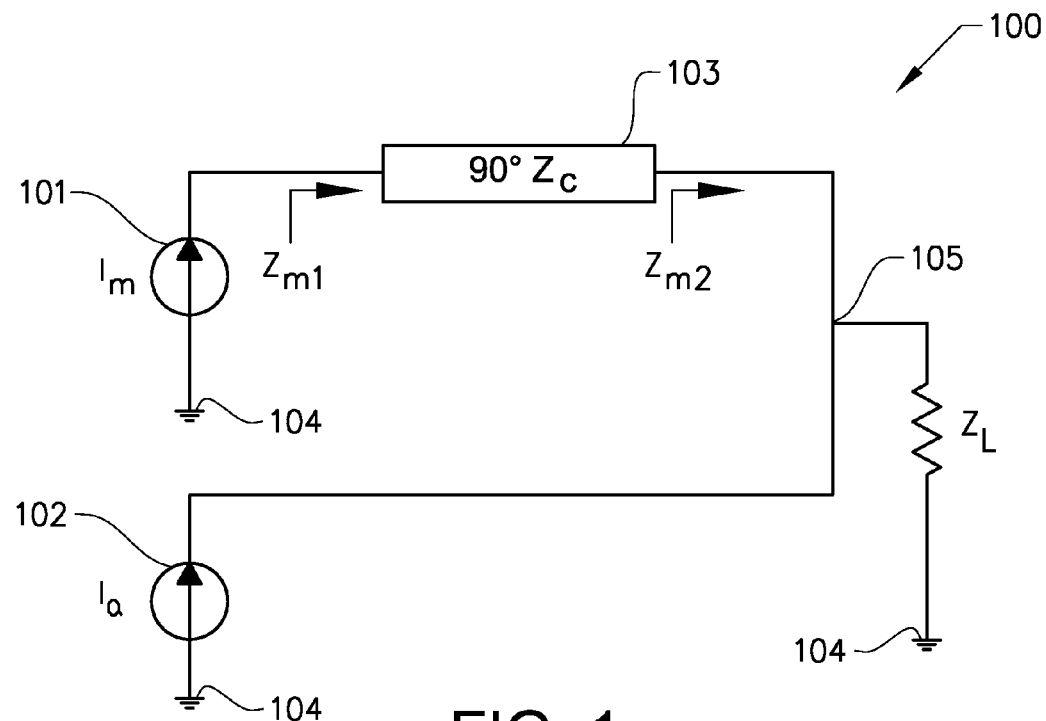
FIG. 1 schematically shows the topology of an ideal Doherty amplifier.
Figure 2:
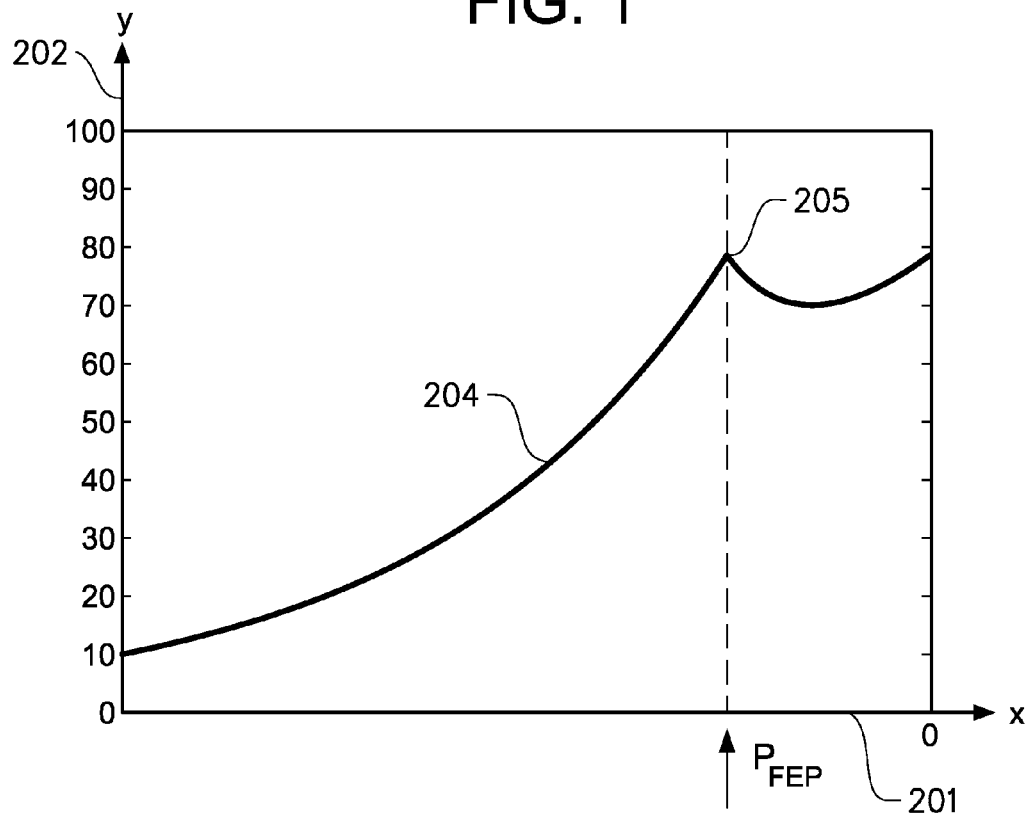
FIG. 2 shows efficiency as a function of the ratio $P_{out}$ to $P_{out,max}$ in dB below $P_{out,max}$ in a diagram at centre frequency for an ideal class B biased Doherty amplifier.
Figure 3:
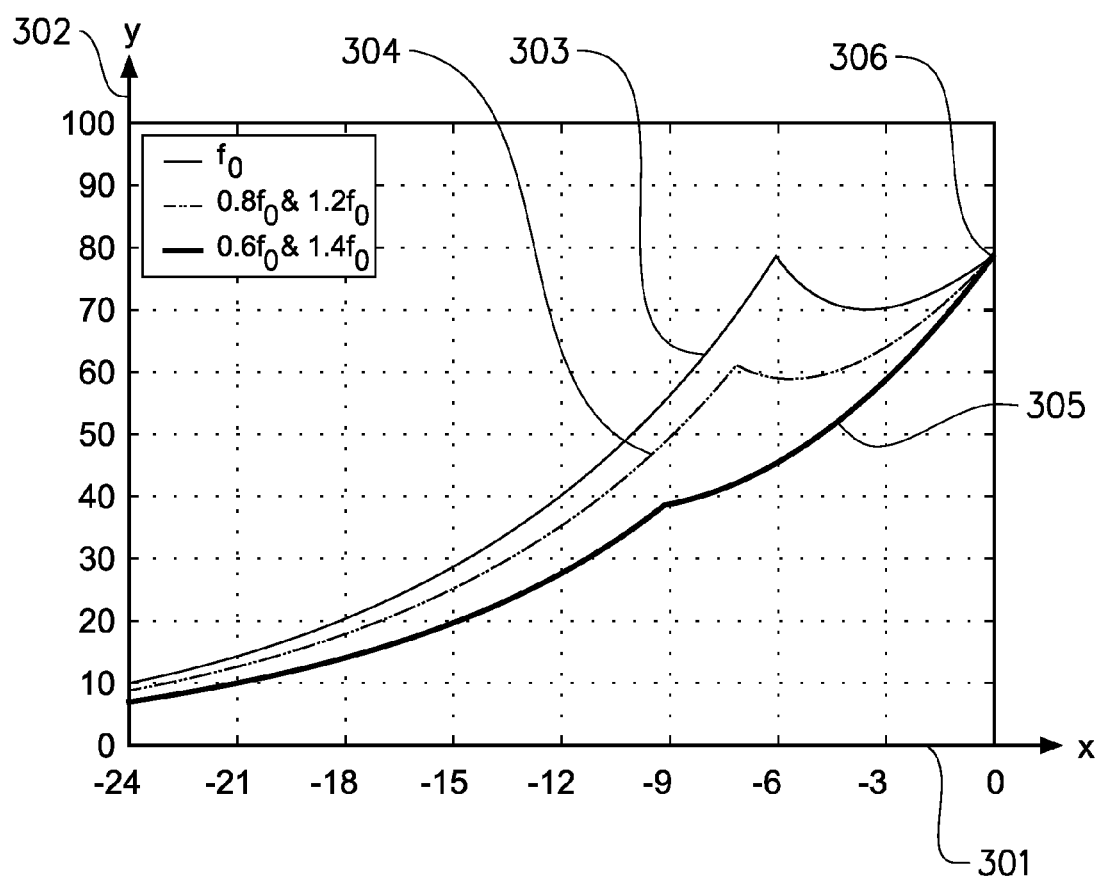
FIG. 3 shows efficiency as a function of the ratio $P_{out}$ to $P_{out,max}$ in dB below $P_{out,max}$ in a diagram at different frequencies for an ideal class B biased Doherty amplifier with $x_b=0.5$.

The invention will now be described with reference to the enclosed drawings, FIGS. 4-8. FIGS. 1-3 are described in association with the Background part. The topology of the Doherty amplifier in FIG. 1 is also used for the power amplifier of the invention with the exception that the electrical length of the main amplifier transmission line does not necessarily have to be a quarter of a wavelength at the centre frequency $f_0$ in all examples and embodiments of the invention. This will be further explained below.

The new power amplifier is based on the topology of the Doherty amplifier and offers identical efficiency performance as the Doherty amplifier at centre frequency. In addition to this, it has a greatly extended bandwidth and offers efficiency curve reconfiguration without any tunable circuit elements.

The invention is not restricted to the use of a certain type of transistor. If a power transistor of FET-type (Field Effect Transistor) is used it has a gate, a drain and a source terminal which is well known to the skilled person. In case a BJT (Bipolar Junction Transistor) or HBT (Heterojunction Bipolar Transistor) is used the terminals are called base, collector and emitter. Henceforth in the description the invention is exemplified with transistors of FET-type and designations and terms are adapted for FET transistors. These terms and designations are however also valid for transistors using base, collector and emitter terminals, i.e. with base corresponding to gate, collector to drain and emitter to source. Some examples; whenever drain-source is mentioned it is also valid for collector-emitter and whenever drain-source bias or drain-source voltage is used it is also valid for collector-emitter bias or collector-emitter voltage and when gate biasing is mentioned it is also valid for base biasing. All examples mentioned are thus also valid for corresponding examples using transistors with base, emitter and collector terminals.

The new power amplifier comprises a main amplifier and an auxiliary amplifier, each arranged to receive an input signal and to operate in parallel and at an output end both being connected to a load $Z_L$. Both amplifiers are arranged to operate over a bandwidth B with a centre frequency $f_0$. The main amplifier is arranged to generate a main amplifier output current $I_m$ and being connected to the load $Z_L$ via a main amplifier transmission line having an input impedance of $Z_{m1}$ to the main amplifier transmission line. The main amplifier transmission line has a characteristic impedance $Z_c$. The auxiliary amplifier is arranged to generate an auxiliary amplifier output current $I_a$ and is connected to the load $Z_L$. The main amplifier is arranged to operate with a drain-source, or collector-emitter, bias $V_{ds,m}$ and the auxiliary amplifier is arranged to operate with a drain-source, or collector-emitter, bias $V_{ds,a}$. The power amplifier is arranged to deliver an output power $P_{out}$, and the auxiliary amplifier output current $I_a$ is arranged to be set to zero below a First Efficiency Peak, FEP. The FEP is defined as the first efficiency peak in the power ratio $P_{out}$ to $P_{out,max}$. $P_{out,max}$ is the maximum power output of the power amplifier and $P_{FEP}$ defines the power ratio at the FEP.

The idea of the proposed new power amplifier originates from the need of wideband/multi standard amplifiers in modern systems with high PAR signals. The new power amplifier share its topology with the Doherty amplifier shown in FIG. 1 and the load modulation is obtained by the same principle as in the Doherty amplifier but, as mentioned above, the electrical length of the main amplifier transmission line does not necessarily have to be a quarter of a wavelength at the centre frequency $f_0$ in all examples and embodiments of the invention. There are, however, also other fundamental differences between the new power amplifier and the Doherty amplifier, dimensioned according to Table 1, in how dimensioning of component values, voltages and currents is performed. As will be explained below, these fundamental differences allow the new power amplifier to have large bandwidth in OPBO in contrast to the Doherty amplifier where large bandwidth only is obtained at full output power. This is an important feature to maintain high average efficiency over a large bandwidth. Moreover, the new power amplifier offers the possibility to reconfigure $P_{FEP}$ without any tunable circuit elements.

The topology of the power amplifier according to the invention is the same as for the Doherty amplifier in FIG. 1 (with exception for the main amplifier transmission line mentioned above), but component values and dimensioning of voltages and currents for the new power amplifier are given in Table 2 below.

The power amplifier can have a single RF-input, splitting an RF-input signal to the power amplifier into a first single input signal for the main amplifier and a second single input signal for the auxiliary amplifier. The second single input signal is also attenuated and phase shifted as is well known to the skilled person. With a single RF-input the main amplifier can be arranged to be biased as a class AB or class B amplifier and the auxiliary amplifier can be arranged to be biased as a class C or B amplifier.

Alternatively the power amplifier can have a dual RF-input, a first input arranged to feed a first dual input signal to the main amplifier and a second input arranged to feed a second dual input signal to the auxiliary amplifier, the first and second dual input signal constituting an RF-input signal to the power amplifier. With a dual RF-input both the main and the auxiliary amplifier can be arranged to be biased as class B amplifiers.

For a given technology certain design rules apply. In this case the values of the drain-source bias $V_{ds,i}$, the load impedance $Z_L$, and the main amplifier transmission line characteristic impedance Z, must be chosen to fulfill $I_{peak,i} \leq I_{sat,i}$ and $V_{peak,i} \leq V_{b,i}$, where $I_{peak,i}$ is the maximum amplifier output current, $I_{sat,i}$ is the amplifier saturation output current, $V_{peak,i}$ is the maximum amplifier output voltage and $V_{b,i}$ is the amplifier break down voltage. The subscript i refers to the main or auxiliary amplifier. Note that $I_{peak,i}$, $I_{sat,i}$, $V_{peak,i}$ and $V_{b,i}$ all refer to time domain peak values including fundamental and harmonic frequencies as well as possible DC current. These design rules are well known for the design of amplifiers and thus well known to the skilled person. As the subscript i refers to the main or auxiliary amplifier, it means that the current and voltage restrictions are valid for both the main amplifier and the auxiliary amplifier.

The values calculated from the equations in Table 2 differs significantly from the ones of the Doherty amplifier given in Table 1, and serves to provide more broadband characteristics as well as reconfiguration of $P_{FEP}$.

TABLE 2

Formulas for load impedance, transmission line characteristic impedance, drain-source bias and amplifier output currents $$V_{ds,m} = x_b V_{ds,a} \quad (9)$$
$$Z_c = V_{ds,a}/I_{max,m} \quad (10)$$
$$Z_L = V_{ds,a}/I_{max,m} \quad (11)$$
$$I_m = \overline{I_m} I_{max,m} \quad 0 < \overline{I_m} < 1 \quad (12)$$

$$I_a = \begin{cases} 0, & 0 \leq \overline{I_m} \leq x_b \\ 2kI_{max,m}(\overline{I_m} - x_b)e^{j\theta}, & x_b < \overline{I_m} \leq 1 \end{cases} \quad (13)$$

$$\theta = \arccos\left(\frac{-k(\overline{I_m} - x_b)\cos(\Phi_{f_0}\bar{f})}{\overline{I_m}}\right), \quad x_b < \overline{I_m} \leq 1 \quad (14)$$

TABLE 2-continued

Formulas for load impedance, transmission line characteristic impedance, drain-source bias and amplifier output currents $$k = \sqrt{\frac{(\overline{I_m}^2 + x_b^2)}{4(\overline{I_m} - x_b)^2} - \frac{1}{4(\overline{I_m} - x_b)}\sqrt{\left(\frac{\overline{I_m}^2 + x_b^2}{\overline{I_m} - x_b}\right)^2 - \left(\frac{\overline{I_m} + x_b}{\sin(\Phi_{f_0}\bar{f})}\right)^2}} \quad (15)$$

$$\bar{f} = \frac{f}{f_0} \quad (16)$$

$I_{max,m}$ is the maximum main amplifier output current amplitude at the fundamental frequency, $V_{ds}$ is the drain-source or collector-emitter bias and $\overline{I_m}$ and $\overline{I_a}$ is the normalized main and auxiliary amplifier output current amplitude at the fundamental frequency, respectively. Added subscript m or a, refers to the main and auxiliary amplifiers, respectively.

The normalized main amplifier output current $\overline{I_m}$ is more precisely defined as the current through the main amplifier $I_m$ divided with the main amplifier maximum output current amplitude at the fundamental frequency $I_{max,m}$, and the normalized auxiliary amplifier output current $\overline{I_a}$ is defined as the auxiliary amplifier output current $I_a$ through the auxiliary amplifier divided with the main amplifier maximum output current amplitude at the fundamental frequency $I_{max,m}$. θ is, as mentioned earlier, the phase difference, expressed in radians, between the auxiliary amplifier output current $I_a$ and the main amplifier output current $I_m$. The expression $V_{ds}$ thus designates the drain-source bias, which is the voltage between drain and source, or the collector-emitter bias, which is the voltage between collector and emitter, depending on type of transistor used, as explained above. $V_{ds,m}$ is thus the drain-source bias or collector-emitter bias for the main amplifier and $V_{ds,a}$ is the drain-source bias or collector-emitter bias for the auxiliary amplifier. $\Phi_{f_0}$ is the electrical length of the main amplifier transmission line expressed in degrees, or radians, at the centre frequency $f_0$.

Maximum performance from the inventive solution is obtained when the power amplifier is dimensioned according to equations in Table 2 above. The dimensioning of the power amplifier can be performed as described in association with FIG. 8, describing one example of the method of the invention. However the invention can also be implemented with somewhat degraded performance when:

- $V_{ds,m}$ is substantially equal to $x_b V_{ds,a}$, here defined as being within a range of ±20% of $x_b V_{ds,a}$, preferably within ±10% but most preferably within ±5% and/or
- $Z_c$ and/or $Z_L$ is/are substantially equal to $V_{ds,a}/I_{max,m}$, here defined as being within a range of ±15% of $V_{ds,a}/I_{max,m}$, preferably within ±10% but most preferably within ±5%. The difference between the values of $Z_c$ and $Z_L$ can thus be at most 30% in the first range, 20% in the second range and 10% in the third range of the maximum performance value according to Table 2.

$I_a$, θ and k can also have corresponding deviations as $V_{ds,m}$ from the maximum performance values given in equations (13), (14) and (15) above. The ranges and deviations specified above are valid for all examples and embodiments of the invention.

The input impedance $Z_{m1}$ to the main amplifier transmission line 103 can be calculated as follows:

$$Z_{m1}(\bar{f}, \Phi_{f_0}) = Z_c \frac{Z_{m2} + jZ_c\tan(\bar{f}\Phi_{f_0})}{Z_c + jZ_{m2}\tan(\bar{f}\Phi_{f_0})} \quad (17)$$

This formula for impedance transformation is well known to the skilled person and therefore not further discussed here. $\Phi_{f_0}$ is the electrical length of the main amplifier transmission line expressed in degrees, or radians, at the centre frequency $f_0$. Below $P_{FEP}$, $Z_{m2}=Z_L$ as $I_a=0$. As $Z_L=Z_c$, see equations (10) and (11), $Z_{m2}$ becomes equal to $Z_c$ which makes $Z_{m1}=Z_c$, see equation (17), and independent of both frequency and the electrical length of the transmission line below $P_{FEP}$ as Z, is independent of frequency according to equation (10). The electrical length $\Phi_{f_0}$ of the main amplifier transmission line will thus not affect the performance of the power amplifier in terms of efficiency and power output below $P_{FEP}$. To obtain optimum efficiency above $P_{FEP}$ at $f_0$, the input impedance $Z_{m1}$ to the main amplifier transmission line 103 should decrease when the output power increases above $P_{FEP}$. The output impedance $Z_{m2}$ of the main amplifier transmission line towards the load $Z_L$ will increase when the auxiliary amplifier output current $I_a$ increases, which means that $Z_{m1}$ should be inversely proportional to $Z_{m2}$. This is obtained in an ideal way by letting the main amplifier transmission line 103 have an electrical length of 90°, or odd multiples of 90°, at $f_0$. This principle is well known to the skilled person and therefore not further discussed here. Solutions with multiples of 90° giving an electrical length above 90° are however larger and more narrow band around $f_0$.

For proper operation above $P_{FEP}$, the electrical length $\theta_{f_0}$ shall thus ideally be set to 90° which also can be expressed as the electrical length shall be a quarter of the wavelength at $f_0$. However the invention can also be implemented with somewhat degraded performance when $\Phi_{f_0}$ is substantially equal 90° above $P_{FEP}$, here defined as being within a range of ±30% from 90°, preferably within ±15% but most preferably within ±10%. These ranges are valid for all examples and embodiments of the invention.

The power amplifier of the invention can thus have a main amplifier transmission line (103) with an electrical length of substantially a quarter of a wavelength at the centre frequency $f_0$.

Each of the amplifiers, the main amplifier and the auxiliary amplifier, can be realized with one power transistor each. There can also be realizations with several power transistors in parallel in the main and/or auxiliary amplifier, i.e. with all source terminals connected to a first common potential, e.g. ground, while the drain terminals are connected to a second common potential, the difference between the first and second potential being equal to $V_{ds,i}$. Simultaneously all gate terminals have a third common potential. The $V_{ds,i}$ is thus the drain-source bias and $V_{b,i}$ is the drain-source breakdown voltage of the power transistor or transistors of the main amplifier or auxiliary amplifier. By coupling power transistors in parallel as described above the output power of the amplifier can be increased as the output current can be increased, the signal gain is however not affected. The amplifiers also comprise additional components like e.g. resistors for biasing and capacitors for DC blockage which is well known to the skilled person and therefore not further discussed here.

The power amplifier can preferably be realized in GaN-HEMT (Gallium Nitride-High Electron Mobility Transistors) technology or LDMOS (Latterally Diffused Metal Oxide Semiconductor) technology. Both techniques offer high power capabilities but the GaN-HEMT technology offers lower output capacitance which is preferable in designs for wide bandwidth. Also, the GaN-HEMT technology offers a possibility for MMIC circuits (Monolithic Microwave Integrated Circuit) which greatly reduces the physical size of the power amplifier as well as providing better high frequency performance. For lower power applications, GaAs-HEMT (Gallium Arsenide-High Electron Mobility Transistors) technology, or HBT (Heterojunction Bipolar Transistor) technology might offer good performance. These are just a few examples of possible realization technologies for the power amplifier. The invention is however not limited to a certain technology, but other suitable technologies can be used within the scope of the invention.

Equation (10) and (11) states that $Z_L$ and $Z_c$ are equal and equation (13) shows that the auxiliary amplifier output current $I_a$ is zero when $\overline{I_m} \leq x_b$, that is; $I_a=0$ below $P_{FEP}$ since $\overline{I_m}=x_b$ at $P_{FEP}$. When $I_a=0$ $Z_{m2}$ will be equal to $Z_L$ and by replacing $Z_{m2}$ with $Z_L$ in equation (8) and observing that $Z_L=Z_c$ it becomes clear that $Z_{m1}=Z_L$ and thus is independent of frequency at normalized output powers below $P_{FEP}$. This is a very important result that makes the efficiency independent of frequency below $P_{FEP}$ and allows the new amplifier to maintain high average efficiency over a wider bandwidth compared to the Doherty amplifier. The amplitude and phase control of the auxiliary amplifier output current serves to minimize the frequency dependency of the efficiency for normalized output power larger than $P_{FEP}$. The optimum amplitude and phase control of the auxiliary amplifier is given by equation (13) and (14) and depends on the amplitude and frequency of the main amplifier output current. The results for $P_{FEP}=-6$ dB are presented in FIGS. 4a and 4b. In the examples of the invention illustrated in the following FIGS. 4-7a, class B biasing is used for both the main and auxiliary amplifier and the electrical length of the main amplifier transmission line is set to a quarter of a wavelength of $f_0$ which can also be expressed as 90 degrees at $f_0$. As mentioned above, and shown in equation (13), $I_a$ is zero below $P_{FEP}$. This means that $I_a$ should be substantially zero, some negligible current, as e.g. a leakage current, could exist.

Figure 4A:
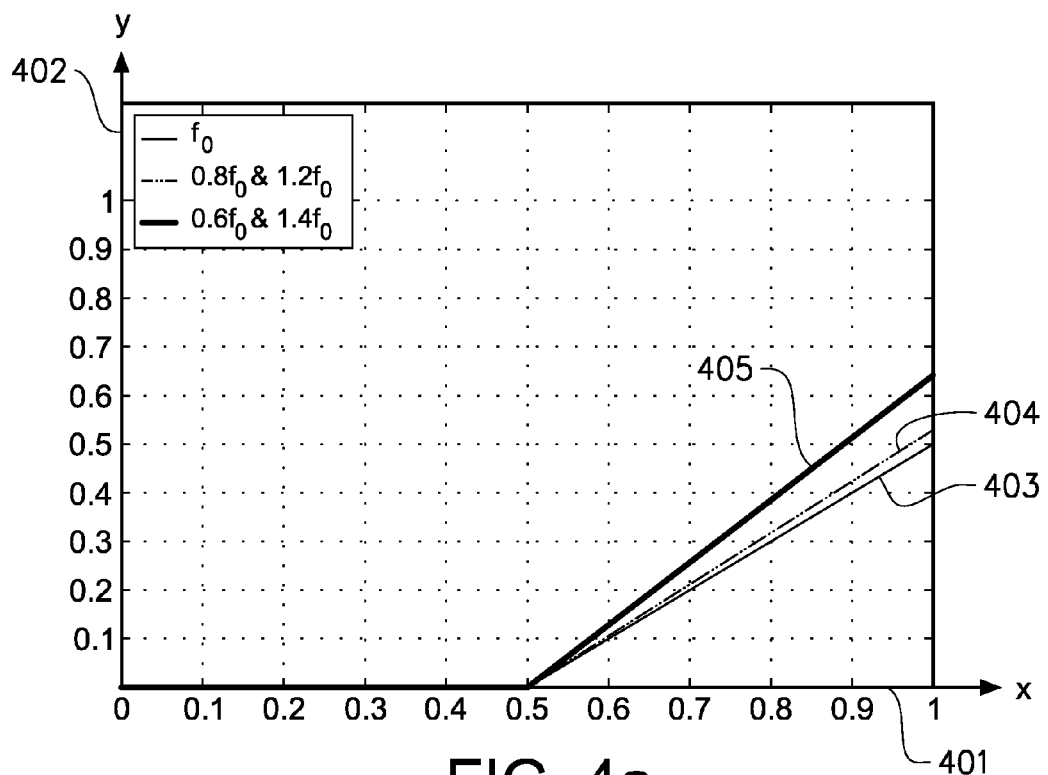
FIG. 4a shows the normalized auxiliary amplifier output current $\overline{I_a}$ as a function of the normalized main amplifier output current $\overline{I_m}$ in a diagram for different frequencies for an example of the invention with $x_b=0.5$.

FIG. 4a shows the normalized auxiliary amplifier output current $\overline{I_a}$ on the y-axis 402 as a function of the normalized main amplifier output current $\overline{I_m}$ on the x-axis 401 from 0.6 $f_0$ to 1.4 $f_0$ when $P_{FEP}=-6$ dB corresponding to $x_b=\overline{I_m}=0.5$ according to formula $x_b=10^{P_{FEP}/20}$. As can be seen in FIG. 4a $I_a$ is zero below $P_{FEP}$. Above $P_{FEP}$ $\overline{I_a}$ is frequency dependent. The first graph 403 shows $\overline{I_a}$ at the centre frequency $f_0$, the second graph 404 shows $\overline{I_a}$ at 0.8 $f_0$ and 1.2 $f_0$ and the third graph 405 shows $\overline{I_a}$ at 0.6 $f_0$ and 1.4 $f_0$.

Figure 4B:
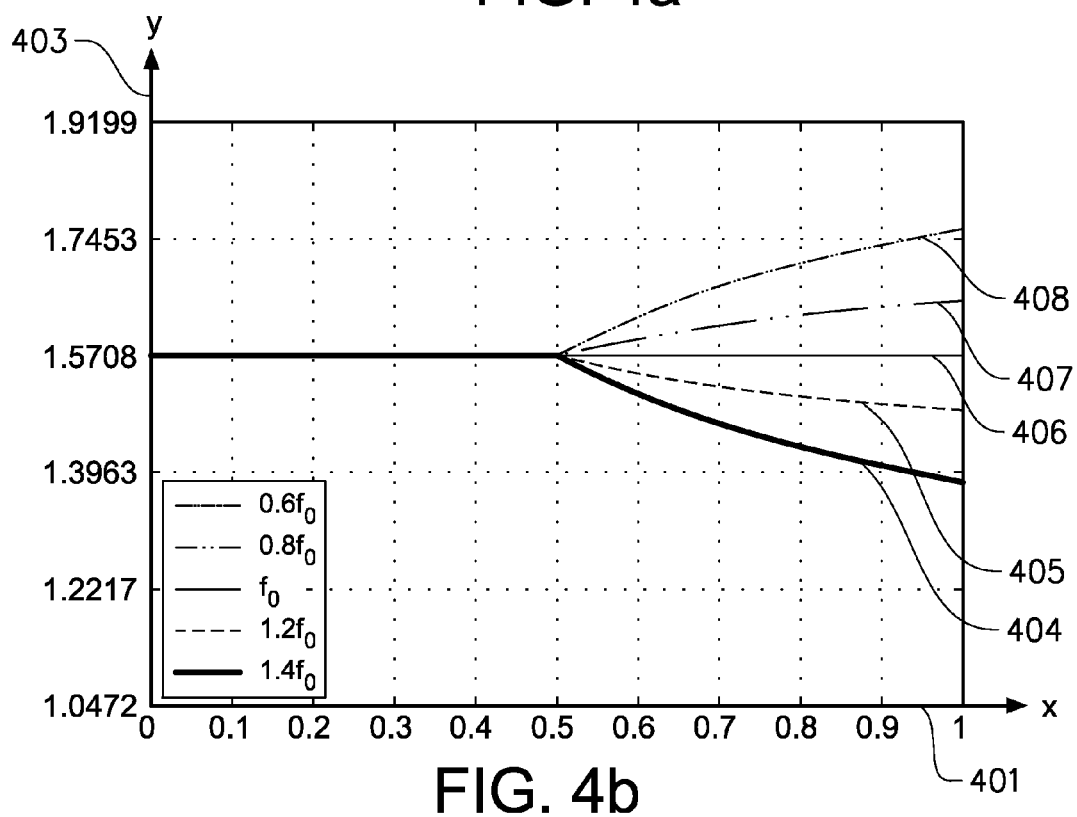
FIG. 4b shows in a diagram the phase difference θ in radians between the auxiliary amplifier output current $I_a$ and the main amplifier output current $I_m$ as a function of the normalized main amplifier output current $\overline{I_m}$ for different frequencies for an example of the invention with $x_b=0.5$.

FIG. 4b shows the phase difference θ in radians between the auxiliary amplifier output current $I_a$ and the main amplifier output current $I_m$ on the y-axis 403 as a function of the normalized main amplifier output current $\overline{I_m}$ on the x-axis 401 for frequencies 1.4 $f_0$ (graph 404), 1.2 $f_0$ (graph 405), $f_0$ (graph 406), 0.8 $f_0$ (graph 407) and 0.6 $f_0$ (graph 408) when $P_{FEP}=-6$ dB corresponding to $x_b=\overline{I_m}=0.5$. As can be seen in FIG. 4b the phase difference θ is frequency dependent above $P_{FEP}$. Below $P_{FEP}$, corresponding to $\overline{I_m}=0.5$, $I_a$ is zero and there is thus no phase difference below $P_{FEP}$. The line below $\overline{I_m}=0.5$ just represents a reference level of 1,5708 radians corresponding to 90 degrees.

The results shown in FIGS. 4a and 4b are based on calculating $I_a$ and θ according to equations (13) and (14) in order to minimize the frequency dependency of efficiency as will be illustrated in FIGS. 5, 6 and 7.

Figure 5A:
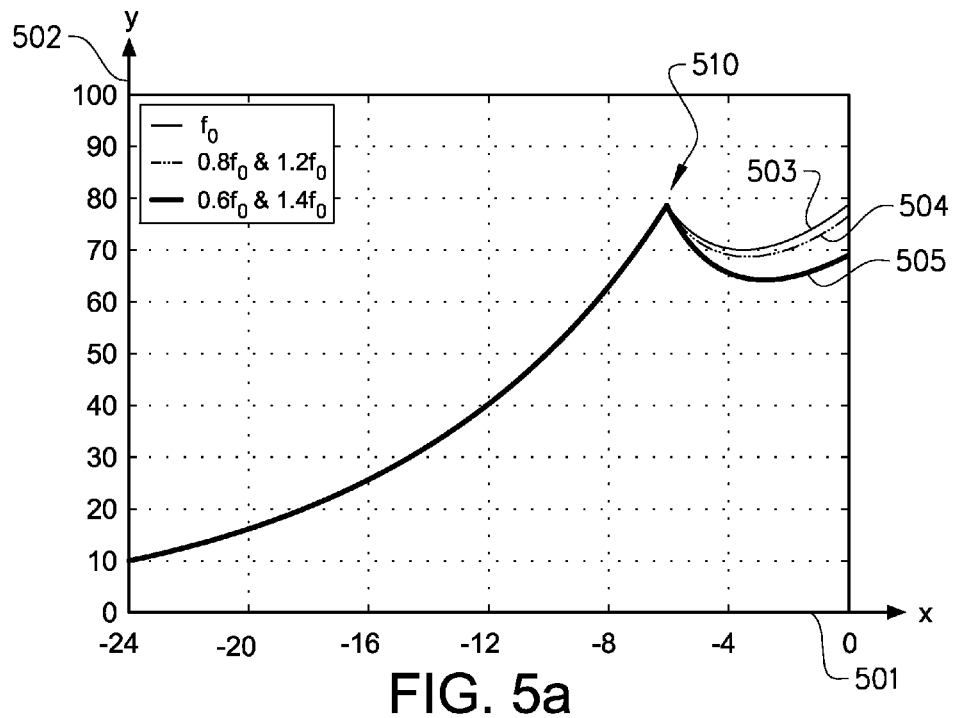
FIG. 5a shows the efficiency in percentage versus the output power ratio $P_{out}/P_{out,max}$ in dB below P out,max in a diagram at different frequencies for $P_{FEP}=-6$ dB for an example of the invention.

The efficiency in percentage on the y-axis 502, resulting from selecting the $I_a$ and θ values according to equation (13) and (14), versus the output power ratio $P_{out}/P_{out,max}$ in dB below $P_{out,max}$ on the x-axis 501 is plotted at different frequencies, in FIG. 5a for $P_{FEP}=-6$ dB and in FIG. 5b for $P_{FEP}=-8$ dB. Graphs 503-505 in FIG. 5a shows efficiency for $P_{FEP}=-6$ dB for frequencies $f_0$ (graph 503), 0.8 & 1.2 $f_0$ (graph 504) and 0.6 & 1.4 $f_0$ (graph 505) respectively. Graphs 506-508 in FIG. 5b shows efficiency for $P_{FEP}=-8$ dB for frequencies $f_0$ (graph 506), 0.8 & 1.2 $f_0$ (graph 507) and 0.6 & 1.4 $f_0$ (graph 508) respectively.

Figure 5B:
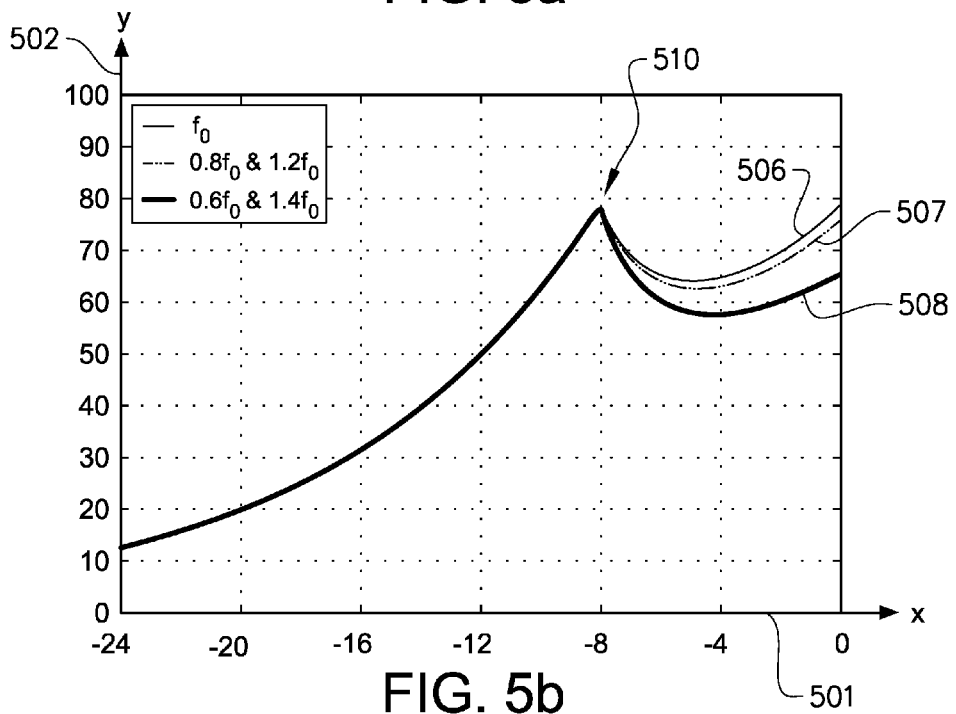
FIG. 5b shows efficiency in percentage versus the output power ratio $P_{out}/P_{out,max}$ in dB below $P_{out,max}$ in a diagram at different frequencies for $P_{FEP}=-8$ dB for an example of the invention.

As can be seen in FIGS. 5a and 5b the efficiency is frequency independent below the first efficiency peak 510 at $P_{FEP}$. Above FEP there is still some frequency dependency, but it is substantially reduced compared to the prior art solution shown in FIG. 3.

In summary the efficiency can be made independent of frequency below $P_{FEP}$ by:
the main amplifier being arranged to be biased by $V_{ds,m}$, being substantially equal to $V_{ds,a}$ times $x_b$, $x_b$ being the main amplifier output current $I_m$ in relation to the maximum current through the main amplifier, $I_{max,m}$, when $P_{out}=P_{FEP}$ and
the impedances of the load $Z_L$ and the main amplifier transmission line 103 both being arranged to be substantially equal to $V_{ds,a}$ divided with $I_{max,m}$ making the input impedance $Z_{m1}$ to the main amplifier transmission line 103 independent of frequency below $P_{FEP}$
while simultaneously the auxiliary amplifier output current $I_a$ is arranged to be set to zero below a First Efficiency Peak, FEP as mentioned earlier. The optimum values for $V_{ds,m}$, and the impedances of the load $Z_L$ and the main amplifier transmission line 103 are given by equations (9), (10) and (11) respectively.

In order to minimize the frequency dependency of the efficiency above FEP the relation between the main amplifier output current $I_m$ and the auxiliary amplifier output current $I_a$ are arranged to be frequency dependent above $P_{FEP}$. In this way the frequency dependency of the efficiency above $P_{FEP}$ can be minimized.

The frequency and amplitude dependency between the main and auxiliary amplifier output currents above FEP can be arranged substantially as follows:

$$I_a = 2kI_{max,m}(\overline{I_m} - x_b)e^{i\theta},$$

$$x_b < \overline{I_m} \leq 1$$

$$\theta = \arccos\left(\frac{-k(\overline{I_m} - x_b)\cos(\Phi_{f_0}\overline{f})}{\overline{I_m}}\right),$$

$$x_b < \overline{I_m} \leq 1$$

$$k = \sqrt{\frac{(\overline{I_m^2} + x_b^2)}{4(\overline{I_m} - x_b)^2} - \frac{1}{4(\overline{I_m} - x_b)}\sqrt{\left(\frac{\overline{I_m^2} + x_b^2}{\overline{I_m} - x_b}\right)^2 - \left(\frac{\overline{I_m} + x_b}{\sin(\Phi_{f_0}\overline{f})}\right)^2}}$$

where $I_{max,m}$ is the maximum current through the main amplifier, $I_a$ is the amplitude of the auxiliary amplifier output current, θ is the phase difference between the auxiliary amplifier output current $I_a$ and the main amplifier output current $I_m$ and $\overline{f}$ is the normalized frequency, defined as the frequency divided with the centre frequency $f_0$. $\Phi_{f_0}$ is the electrical length of the main amplifier transmission line expressed in degrees, or radians, at the centre frequency $f_0$ and $\Phi_{f_0}$ is arranged to be substantially equal to 90 degrees above FEP as explained above. "Above FEP" can also be expressed as "above $P_{FEP}$" as is evident from e.g. FIG. 5.

Figure 6A:
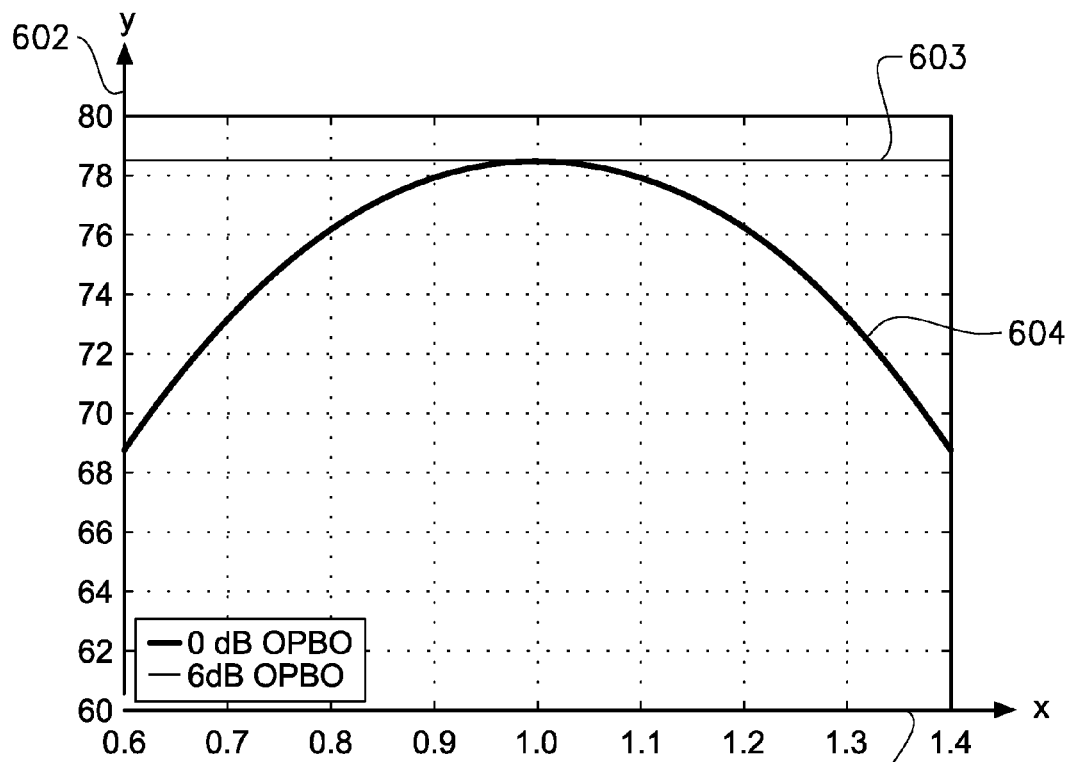
FIG. 6a shows efficiency in percentage versus normalized frequency in a diagram at full output power, OPBO=0 dB, and OPBO=6 dB, for $P_{FEP}=-6$ dB for an example of a power amplifier according to the invention.
Figure 6B:
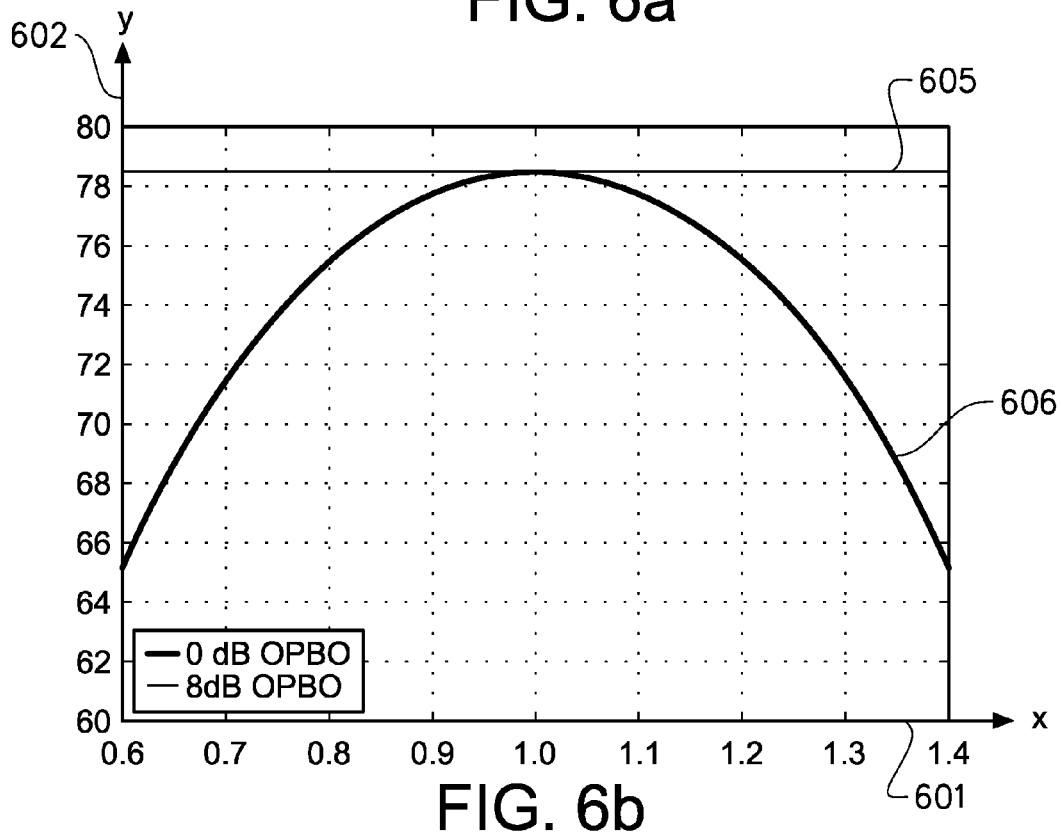
FIG. 6b shows efficiency in percentage versus normalized frequency in a diagram at full output power, OPBO=0 dB, and OPBO=8 dB, for $P_{FEP}=-8$ dB for an example of a power amplifier according to the invention.

In FIG. 6 efficiency in percentage on the y-axis 602 versus normalized frequency on the x-axis 601 is plotted at full output power, OPBO=0 dB, and at $P_{FEP}$ for amplifiers according to the invention with $P_{FEP}=-6$ dB, i.e. OPBO=6 dB, in FIG. 6a and with $P_{FEP}=-8$ dB, i.e. OPBO=8 dB, in FIG. 6b. In FIG. 6a graph 603 representing OPBO=6 dB shows that efficiency is frequency independent at that OPBO while graph 604, representing OPBO=0 dB, shows some frequency dependency. In FIG. 6b graph 605, representing OPBO=8 dB, shows that efficiency is frequency independent at that OPBO while graph 606, representing OPBO=0 dB, shows some frequency dependency.

Figure 7A:
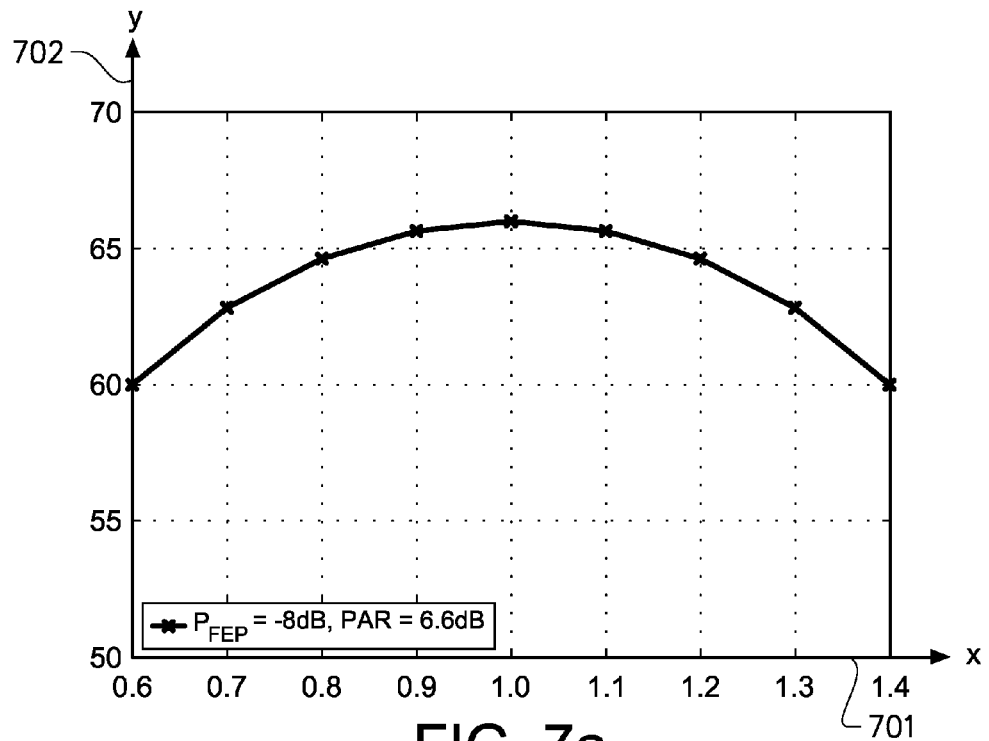
FIG. 7a shows in a diagram average efficiency in percentage for an example of the invention with a 6.6 dB PAR WCDMA signal according to FIG. 7b, versus normalized frequency, when $P_{FEP}$ is set to −8 dB.
Figure 7B:
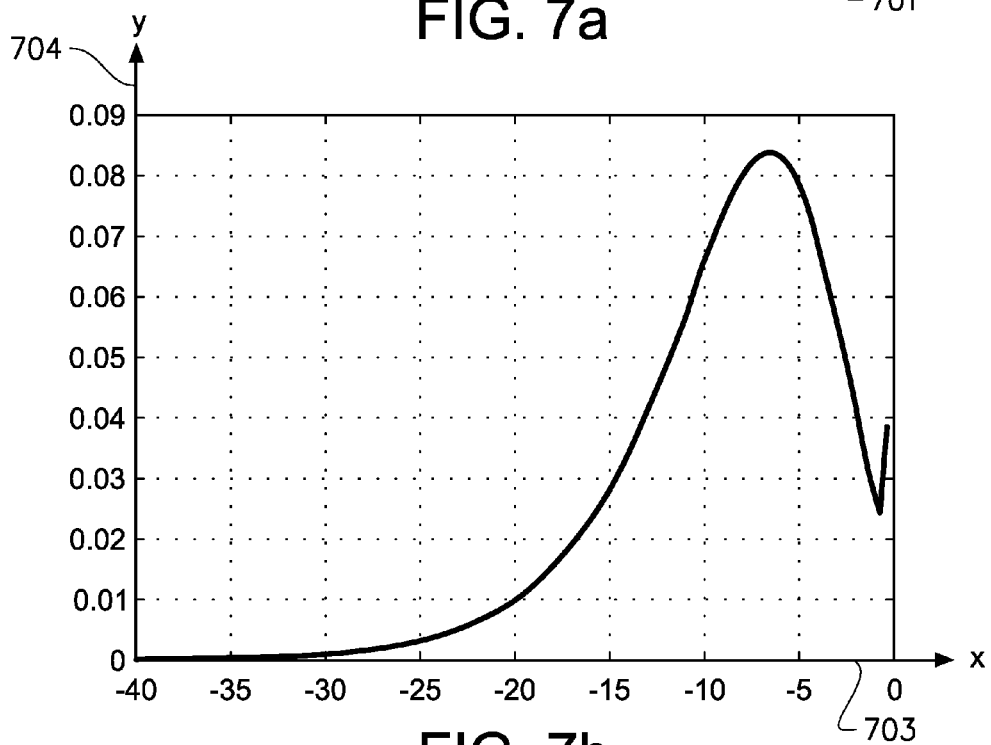
FIG. 7b shows in a diagram a 6.6 dB PAR WCDMA signal.

FIG. 5 clearly indicates that the new power amplifier should be able to keep a high average efficiency over a very wide bandwidth. This is confirmed in FIG. 7a where the average efficiency in percentage, on the y-axis 702, for a 6.6 dB PAR WCDMA (Wideband Code Division Multiple Access, WCDMA is a technology used in wireless communication systems) signal according to FIG. 7b, is plotted versus normalized frequency, on the x-axis 701, when $P_{FEP}$ is set to −8 dB. The average efficiency is degraded around 6 percentage points when going from $\bar{f}$=1.0 to $\bar{f}$=0.6/1.4. By comparing FIG. 5 and FIG. 3 it is evident that a Doherty amplifier will be much more narrowband than the new power amplifier according to the invention when the average efficiency of a modulated signal is considered.

The Probability Density of a 6.6 dB PAR WCDMA signal is shown in FIG. 7b as a function of the ratio $P_{out}/P_{out,max}$ with the Probability Density on the y-axis 704 and the power ratio in dB below $P_{out,max}$ on the x-axis 703. The Probability Density Function, PDF, being the function that describes the relative likelihood for a random variable, in this case the power ratio, to occur at a given point. The probability for the output power to fall within a particular region is given by the integral of the probability density of the output power over the region.

The expression for k according to equation (15) generates real values within a certain frequency range or bandwidth. Outside of this bandwidth, k will become a complex value and the expression for k is no longer valid. The bandwidth within which k is valid is given by $x_b$ according to the relation:

$$\sin(\Phi_{f_0} \bar{f}) > \frac{1 - x_b^2}{1 + x_b^2} \quad (18)$$

where $\bar{f}$ must be chosen such that the relation is valid.

If $P_{FEP}$ is set to −6 dB ($x_b$=0.5) and $\Phi_{f_0}$ equal to 90°, the maximum valid bandwidth becomes 118% and if $P_{FEP}$ is set to −8 dB the maximum valid bandwidth becomes 96%. This is calculated by solving for $\bar{f}$ in equation (18). Typical values for commercial standard amplifiers with dimensioning and topology as a Doherty amplifier is a bandwidth in the order of 5-15%.

The expressions in equations (13), (14) and (15) are found by optimizing the efficiency for each output power and frequency under the condition of linear voltage gain on all frequencies. The factor k can be interpreted as a frequency and current dependent scaling factor.

In contrast to a Doherty amplifier, the equations in table 2 show that none of the circuit elements, i.e. the load $Z_L$ and the main amplifier transmission line 103, and dimensioning currents and voltages in the new power amplifier depend on $x_b$ except for $V_{ds,m}$ and $I_a$, that are $x_b$-dependent. This fact makes reconfiguration of $P_{FEP}$ very easy for the new power amplifier compared to the Doherty amplifier, without the need for any tunable element. The reconfiguration of $P_{FEP}$ thus only requires the drain-source voltage $V_{ds,m}$, and the auxiliary amplifier output current $I_a$, to be adjusted as $P_{FEP}$ is depending on $x_b$ according to $x_b=10^{P_{FEP}/20}$. This can also be expressed as $P_{FEP}$ and $x_b$ can be arranged to be reconfigured, as the load impedance $Z_L$ is independent of frequency and $x_b$, without affecting hardware by changing the drain-source, or collector-emitter, bias $V_{ds,m}$ and the auxiliary amplifier output current $I_a$, $x_b$ being equal to $10^{P_{FEP}/20}$.

The maximum output power obtainable with the new power amplifier will be 3 dB less than from a Doherty amplifier if identical amplifier topologies are used. However, by reducing the physical size of the auxiliary amplifier transistor/transistors and/or using main amplifier transistor/transistors with lower drain-source break down voltage $V_b$, the PUF will be less degraded compared to the Doherty amplifier since $V_{peak,m}$ and $I_{peak,a}$ will be closer to $V_{b,m}$ and $I_{sat,a}$, respectively. The output power level obtainable with the new power amplifier is however not affected by these PUF increasing actions. The PUF value can be said to describe how well the maximum output power capability of the transistor is used.

As mentioned earlier, the new power amplifier benefits from careful control of the main- and auxiliary amplifier current amplitudes and their relative phases. The most straight forward way to obtain the desired $I_m$ and $I_a$ characteristics is by using dual RF-inputs. But also a single RF-input, where the RF-signal coupled to the auxiliary amplifier is attenuated and phase shifted, by active or passive means, can be used. The implementations of the new design are power amplifiers in RF and radio transmitters used e.g. in RBS where high efficiency in OPBO, large bandwidth and/or $P_{FEP}$-reconfiguration is desired.

As demonstrated in the previous section, the efficiency of the new power amplifier does not depend on frequency below $P_{FEP}$ and the frequency dependency above $P_{FEP}$ is limited. Compared to the Doherty amplifier, this implies, as shown above, a much more broadband average efficiency for high PAR signals which makes the new power amplifier more suitable in wideband applications than an amplifier with topology and dimensioning as a Doherty amplifier.

A further advantage of the new power amplifier is the possibility to reconfigure $P_{FEP}$ by changing $V_{ds,m}$ and the auxiliary amplifier output current $I_a$. This is not possible in the Doherty amplifier where $Z_L$ depends on $P_{FEP}$ and $x_b$. In the new power amplifier $P_{FEP}$ and $x_b$ can be arranged to be reconfigured, as the load impedance $Z_L$ is independent of frequency and $x_b$, without affecting hardware by changing the drain-source bias $V_{ds,m}$ and the auxiliary output current $I_a$, $x_b$ being equal to $10^{P_{FEP}/20}$.

The possibility to reconfigure $P_{FEP}$ is an important feature in multi standard amplifier and software defined radio applications.

Figure 8:
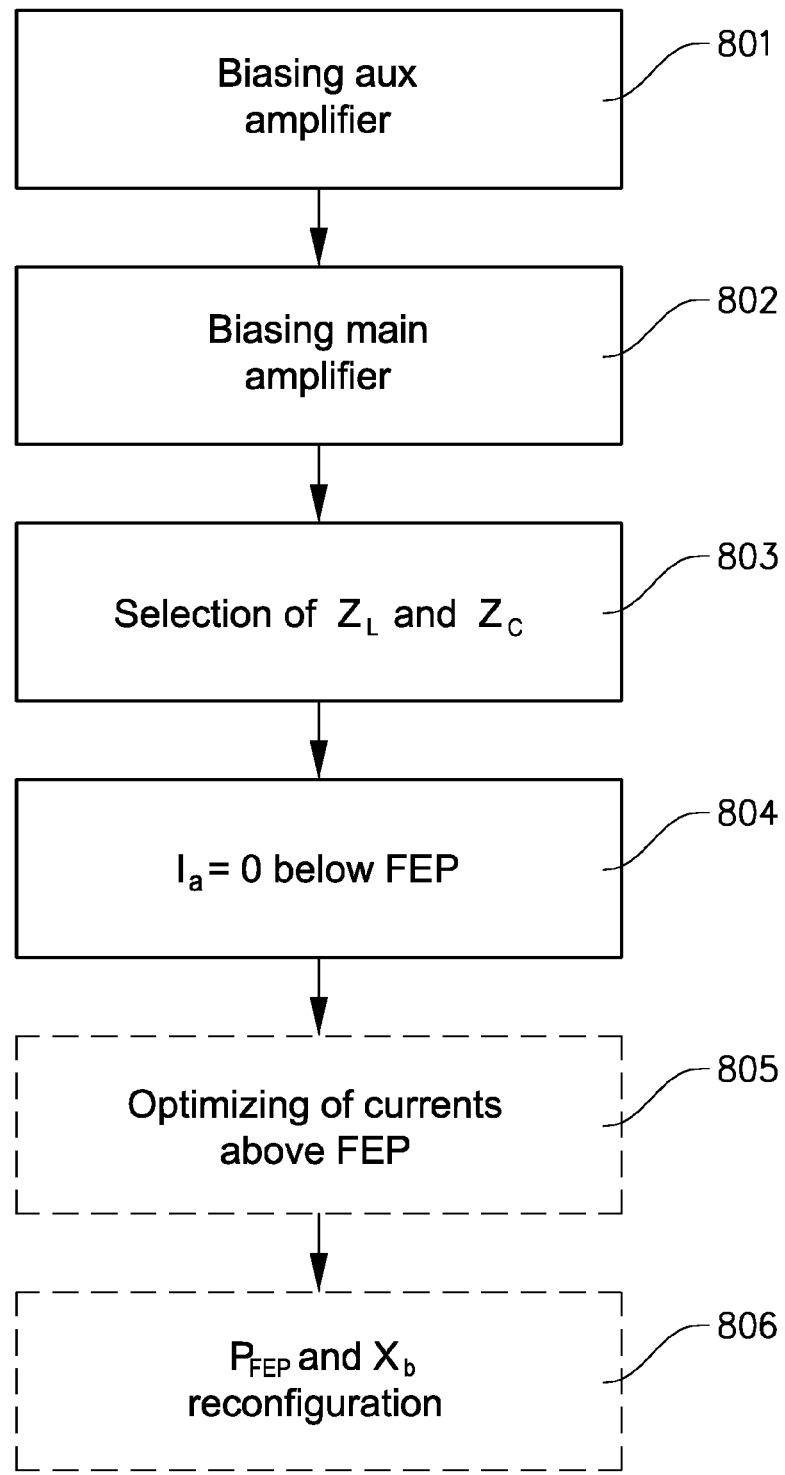
FIG. 8 schematically shows a block diagram of an example of the method of the invention.

The invention also provides a method for power amplification which is illustrated in FIG. 8.

In a first method step 801, the auxiliary amplifier is biased by adjusting the drain-source bias of the auxiliary amplifier for operation with the selected transistor/transistors in the auxiliary amplifier.

In a second method step 802, the main amplifier is biased by setting $V_{ds,m}$ equal to, or substantially equal to, the auxiliary amplifier bias $V_{ds,a}$ times $x_b$, $x_b$ being the main amplifier output current $I_m$ in relation to the maximum current through the main amplifier, $I_{max,m}$, when $P_{out}=P_{FEP}$.

In a third method step 803, the impedances of the load $Z_L$ and the main amplifier transmission line 103 are both selected to be equal to, or substantially equal to, $V_{ds,a}$ divided with $I_{max,m}$ making the input impedance $Z_{m1}$ to the main amplifier transmission line 103 independent of frequency below $P_{FEP}$.

In a fourth method step 804 the frequency dependent auxiliary amplifier output current $I_a$ is set to zero below the First Efficiency Peak, FEP, being defined as the first efficiency peak in the power ratio $P_{out}$ to $P_{out,max}$, $P_{out,max}$ being the maximum power output of the power amplifier and $P_{FEP}$ defining the power ratio at the First Efficiency Peak. This can be accomplished by any conventional means such as controlling the auxiliary amplifier drive signal or by controlling the gate (base) of the transistor/transistors of the auxiliary amplifier. Setting $I_a$ to zero means that $I_a$ should be substantially zero, some negligible current, as e.g. a leakage current, could exist.

In the first and the second method step the gate bias is also adjusted for operation with the selected transistor/transistors according to well known principles. The gate biasing is important for the choice of biasing the amplifiers as class AB, B or C as is well known to the skilled person.

By performing these four method steps, not necessarily in the order described above, the efficiency is made independent of frequency below $P_{FEP}$.

In a preferred optional fifth method step 805 optimizing of currents above FEP is performed by the relation between the main amplifier output current $I_m$ and the auxiliary amplifier output current $I_a$ are selected to be frequency dependent above $P_{FEP}$) thus minimizing the frequency dependency of the efficiency above $P_{FEP}$.

In a preferred optional sixth method step 806, $P_{FEP}$ and $x_b$ are reconfigured. As the load impedance $Z_L$ is independent of frequency and $x_b$, this can be accomplished without affecting hardware by changing the drain-source bias $V_{ds,m}$ and the auxiliary amplifier output current $I_a$, $x_b$ being equal to $10^{P_{FEP}/20}$.

Adjustment of the electrical length of the main amplifier transmission line 103 may be performed in any of the above mentioned method steps, preferably in one of the steps 801-805.

The invention can be realized without implementing the fifth and sixth method steps. The implementation of these method steps will however improve performance. The method steps do not necessarily have to be performed in the order described above; the order between method steps 801-804 can e.g. be changed.

In summary the invention also provides a method for power amplification using a main amplifier and an auxiliary amplifier each receiving an input signal. The amplifiers are operating in parallel and are both connected to the load $Z_L$ at an output end. Both amplifiers operates over a bandwidth B with a centre frequency $f_0$. The main amplifier generates a main amplifier output current $I_m$ and is connected to the load $Z_L$ via a main amplifier transmission line 103. The main amplifier has an input impedance of $Z_{m1}$ to the main amplifier transmission line 103. The main amplifier transmission line 103 has a characteristic impedance Z. The auxiliary amplifier generates an auxiliary amplifier output current $I_a$ and is connected to the load $Z_L$. The main amplifier operates with a drain-source, or collector-emitter, bias $V_{ds,m}$ and the auxiliary amplifier is operating with a drain-source, or collector-emitter, bias $V_{ds,a}$. The power amplifier delivers an output power $P_{out}$. A First Efficiency Peak, FEP is defined as the first efficiency peak in the power ratio $P_{out}$ to $P_{out,max}$. $P_{out,max}$ is the maximum power output of the power amplifier and $P_{FEP}$ defines the power ratio at the First Efficiency Peak wherein following steps are performed:

biasing the auxiliary amplifier, 801, by adjusting the $V_{ds,a}$ for operation with the selected transistor/transistors in the auxiliary amplifier, biasing the main amplifier, 802, by setting $V_{ds,m}$, substantially equal to $V_{ds,a}$ times $x_b$, $x_b$ being the main amplifier output current $I_m$ in relation to the maximum current through the main amplifier, $I_{max,m}$, when $P_{out}=P_{FEP}$, selecting the impedances of the load $Z_L$ and the main amplifier transmission line 103 both to be substantially equal to $V_{ds,a}$ divided with $I_{max,m}$, 803, making the input impedance $Z_{m1}$ to the main amplifier transmission line 103 independent of frequency below $P_{FEP}$, and setting the auxiliary amplifier output current $I_a$ to zero, 804, below the FEP thus making the efficiency independent of frequency below $P_{FEP}$.

In one example of the method the main amplifier transmission line 103 has an electrical length of substantially a quarter of a wavelength at the centre frequency $f_0$.

In one example of the method, optimizing of currents above FEP, 805, is performed by the relation between the main amplifier output current $I_m$ and the auxiliary amplifier output current $I_a$ being selected to be frequency dependent above $P_{FEP}$, thus minimizing the frequency dependency of the efficiency above $P_{FEP}$.

In one example of the method, optimizing of currents above FEP, 805, is performed by the frequency and amplitude dependency between the main and auxiliary amplifier output currents being configured substantially as follows:

$$I_a = 2kI_{max,m}(\overline{I_m} - x_b)e^{i\theta},$$

$$x_b < \overline{I_m} \leq 1$$

$$\theta = \arccos\left(\frac{-k(\overline{I_m} - x_b)\cos(\Phi_{f_0}\overline{f})}{\overline{I_m}}\right),$$

$$x_b < \overline{I_m} \leq 1$$

$$k = \sqrt{\frac{(\overline{I_m}^2 + x_b^2)}{4(\overline{I_m} - x_b)^2} - \frac{1}{4(\overline{I_m} - x_b)}\sqrt{\left(\frac{\overline{I_m}^2 + x_b^2}{\overline{I_m} - x_b}\right)^2 - \left(\frac{\overline{I_m} + x_b}{\sin(\Phi_{f_0}\overline{f})}\right)^2}}$$

where $I_{max,m}$ is the maximum current through the main amplifier, $I_a$ is the amplitude of the auxiliary amplifier output current, $\theta$ is the phase difference between the auxiliary amplifier output current $I_a$ and the main amplifier output current $I_m$ and $\overline{f}$ is the normalized frequency, defined as the frequency divided with the centre frequency $f_0$. $\Phi_{f_0}$ is the electrical length of the main amplifier transmission line expressed in degrees, or radians, at the centre frequency $f_0$ and $\Phi_{f_0}$ is adjusted to be substantially equal to 90 degrees above FEP.

In one example of the method, $P_{FEP}$ and $x_b$ may be reconfigured, 806, as the load impedance $Z_L$ is independent of frequency and $x_b$, without affecting hardware by changing the drain-source, or collector-emitter, bias $V_{ds,m}$ and the auxiliary amplifier output current $I_a$, $x_b$ being equal to $10^{P_{FEP}/20}$.

The invention also provides a node in a wireless communication system, wherein the node comprises a power amplifier according to any one of the claims 1-9. The wireless communication system can e.g. be based on 3G (Third generation mobile telecommunication), 4G (Fourth generation mobile telecommunication), LTE (Long term evolution) or WiMax (Worldwide interoperability for microwave access). The invention is however not restricted to a certain type of wireless communication system but can also be used in any other wireless communication applications or electronic systems requiring signal amplification.

The invention is not limited to the embodiments and examples described above, but may vary freely within the scope of the appended claims.

The invention claimed is:

1. A power amplifier comprising:
a main amplifier connected at an output end to a load, wherein the main amplifier is connected to the load via a main amplifier transmission line having an input impedance and a characteristic impedance, and wherein the main amplifier is configured to:

receive an input signal;
generate a main amplifier output current; and
operate with a drain-source or collector-emitter bias $V_{ds,m}$; and
an auxiliary amplifier connected at an output end to the load, and configured to:
receive an input signal;
generate an auxiliary amplifier output current; and
operate with a drain-source or collector-emitter bias $V_{ds,c}$;
wherein each of the main amplifier and auxiliary amplifier are configured to operate over a bandwidth having a center frequency;
wherein the power amplifier is configured to deliver an output power $P_{out}$;
wherein the auxiliary amplifier output current is configured to be set to zero below a First Efficiency Peak (FEP), the FEP being a first efficiency peak in the power ratio $P_{out}$ to $P_{outmax}$, $P_{outmax}$ being a maximum power output of the power amplifier and $P_{FEP}$ defining a power ratio at the FEP;
wherein the main amplifier is further configured to be biased by $V_{ds,m}$ being substantially equal to $V_{ds,a}$ times $x_b$, $x_b$ being a main amplifier output current in relation to a maximum current through the main amplifier, $I_{max,m}$, when $P_{OUT}=P_{FEP}$; and
wherein the impedance of the load and the impedance of the main amplifier transmission line are both arranged to be substantially equal to $V_{ds,a}$ divided by $I_{max,m}$, making the input impedance to the main amplifier transmission line independent of frequency below $P_{FEP}$, and also making the efficiency of the power amplifier independent of frequency below $P_{FEP}$.

2. The power amplifier of claim 1, wherein the power amplifier has a single RF-input that is split into a first single input signal for the main amplifier and a second single input signal for the auxiliary amplifier.

3. The power amplifier of claim 2, wherein the main amplifier is configured to be biased as a class AB or class B amplifier, and the auxiliary amplifier is configured to be biased as a class C or B amplifier.

4. The power amplifier of claim 1, wherein the power amplifier has a dual RF-input comprising:
a first input configured to provide a first dual input signal as the input signal of the main amplifier; and
a second input configured to provide a second dual input signal as the input signal of the auxiliary amplifier;
wherein the first and second dual input signals constitute an RF-input signal to the power amplifier.

5. The power amplifier of claim 4, wherein both the main and the auxiliary amplifier are configured to be biased as class B amplifiers.

6. The power amplifier of claim 1, wherein the main amplifier transmission line has an electrical length of substantially a quarter of a wavelength at the center frequency.

7. The power amplifier of claim 1, wherein a relation between the main amplifier output current and the auxiliary amplifier output current is arranged to be frequency dependent above $P_{FEP}$, thus minimizing the frequency dependency of the efficiency above $P_{FEP}$.

8. The power amplifier of claim 7, wherein a frequency and amplitude dependency between the main and auxiliary amplifier output currents above the FEP is arranged substantially as follows:

$$I_a = 2kI_{max,m}(\overline{I_m} - x_b)e^{i\theta},$$

$$x_b < \overline{I_m} \le 1$$

$$\theta = \arccos\left(\frac{-k(\overline{I_m} - x_b)\cos(\Phi_{f_0}\bar{f})}{\overline{I_m}}\right),$$

$$x_b < \overline{I_m} \le 1$$

$$k = \sqrt{\frac{(\overline{I_m}^2 + x_b^2)}{4(\overline{I_m} - x_b)^2} - \frac{1}{4(\overline{I_m} - x_b)}\sqrt{\left(\frac{\overline{I_m}^2 + x_b^2}{\overline{I_m} - x_b}\right)^2 - \left(\frac{\overline{I_m} + x_b}{\sin(\Phi_{f_0}\bar{f})}\right)^2}}$$

where $I_{max,m}$ is a maximum current through the main amplifier, $I_a$ is an amplitude of the auxiliary amplifier output current, $\theta$ is a phase difference between the auxiliary amplifier output current and the main amplifier output current, $\bar{f}$ is a normalized frequency defined as the frequency divided by the center frequency, and $\Phi_{fc}$ is an electrical length of the main amplifier transmission line expressed in degrees or radians at the center frequency, $\Phi_{fc}$ being arranged to be substantially equal to 90 degrees above the FEP.

9. The power amplifier of claim 1:
wherein $x_b$ is equal to $1U^{P_{FEP}/20}$; and
wherein $P_{FEP}$ and $x_b$ are arranged to be reconfigured, as the load impedance is independent of frequency and $x_b$ without affecting hardware by changing the drain-source or collector-emitter bias $V_{ds,m}$ and the auxiliary amplifier output current.

10. The power amplifier of claim 1, wherein the power amplifier is included in a node in a wireless communication system.

11. A method of operating a power amplifier to deliver an output power $P_{out}$, the power amplifier including a main amplifier and an auxiliary amplifier each receiving an input signal, operating in parallel, being connected to a load at an output end, and operating over a bandwidth B having a center frequency, the method comprising:
generating a main amplifier output current from the main amplifier, the main amplifier being connected to the load via a main amplifier transmission line having an input impedance and a characteristic impedance;
operating the main amplifier with a drain-source or collector-emitter bias $V_{ds,m}$;
biasing the main amplifier by setting $V_{ds,m}$ substantially equal to $V_{ds,s}$ times $x_b$, $x_b$ being a main amplifier output current in relation to a maximum current through the main amplifier, $I_{max,m}$, when $P_{out}=P_{FEP}$;
generating an auxiliary amplifier output current from the auxiliary amplifier;
operating the auxiliary amplifier with a drain-source or collector-emitter bias $V_{ds,a}$;
biasing the auxiliary amplifier by adjusting $V_{ds,a}$ for operation with one or more selected transistors in the auxiliary amplifier;
setting the auxiliary amplifier output current to zero below a First Efficiency Peak (FEP), thus making the efficiency independent of frequency below $P_{FEP}$; and
selecting the impedances of the load and the main amplifier transmission line both to be substantially equal to $V_{ds,a}$ divided by $I_{max,m}$, making the input impedance to the main amplifier transmission line independent of frequency below $P_{FEP}$;
wherein the FEP is defined as a first efficiency peak in the power ratio $P_{out}$ to $P_{outmax}$;

wherein $P_{outmax}$ is a maximum power output of the power amplifier; and wherein $P_{FEP}$ is a power ratio at the FEP.

12. The method of claim 11, wherein the main amplifier transmission line has an electrical length of substantially a quarter of a wavelength at the center frequency.

13. The method of claim 11, further comprising:

optimizing currents above the FEP by selecting the main amplifier output current and the auxiliary amplifier output current to be frequency dependent above $P_{FEP}$, thus minimizing the frequency dependency of the efficiency above $P_{FEP}$.

14. The method of claim 13, further comprising:

optimizing currents above the FEP by configuring a frequency and amplitude dependency between the main and auxiliary amplifier output currents substantially as follows:

$$I_a = 2kI_{max,m}(\overline{I_m} - x_b)e^{i\theta},$$

$$x_b < \overline{I_m} \le 1$$

$$\theta = \arccos\left(\frac{-k(\overline{I_m} - x_b)\cos(\Phi_{f_0}\overline{f})}{\overline{I_m}}\right),$$

-continued $$x_b < \overline{I_m} \le 1$$

$$k = \sqrt{\frac{(\overline{I_m^2} + x_b^2)}{4(\overline{I_m} - x_b)^2} - \frac{1}{4(\overline{I_m} - x_b)}\sqrt{\left(\frac{\overline{I_m^2} + x_b^2}{\overline{I_m} - x_b}\right)^2 - \left(\frac{\overline{I_m} + x_b}{\sin(\Phi_{f_0}\overline{f})}\right)^2}}$$

where $I_{max/m}$ is a maximum current through the main amplifier, $I_a$ is an amplitude of the auxiliary amplifier output current, $\theta$ is a phase difference between the auxiliary amplifier output current and the main amplifier output current, $\overline{f}$ is a normalized frequency defined as the frequency divided by the center frequency, and $\Phi_{fc}$ is an electrical length of the main amplifier transmission line expressed in degrees or radians at the center frequency, $\Phi_{fc}$ being adjusted to be substantially equal to 90 degrees above the FEP.

15. The method of claim 11, further comprising:

reconfiguring $P_{FEP}$ and $x_b$, as the load impedance is independent of frequency and $x_b$ without affecting hardware by changing the drain-source or collector-emitter bias $V_{ds,m}$ and the auxiliary amplifier output current;

wherein $x_b$ is equal to $10^{P_{FEP}/20}$.

* * * * *

UNITED STATES PATENT AND TRADEMARK OFFICE
CERTIFICATE OF CORRECTION

| | | |
|---|---|---|
| PATENT NO. | : 9,019,015 B2 | |
| APPLICATION NO. | : 14/009163 | |
| DATED | : April 28, 2015 | |
| INVENTOR(S) | : Gustafsson et al. | |

It is certified that error appears in the above-identified patent and that said Letters Patent is hereby corrected as shown below:

On the Title Page, in Item (57), under "ABSTRACT", in Column 2, Line 5, delete "$P_{outmax}. P_{outmax}$" and insert -- $P_{out,max}. P_{out,max}$ --, therefor.

On the Title Page, in Item (57), under "ABSTRACT", in Column 2, Line 9, delete "times $x_b$" and insert -- times $x_b$, --, therefor.

Specification

In Column 4, Line 35, delete "0.8 f0 and 1.2 f0" and insert -- 0.8 $f_0$ and 1.2 $f_0$ --, therefor.

In Column 5, Line 23, delete "Z." and insert -- $Z_c$. --, therefor.

In Column 6, Line 42, delete "P out,max" and insert -- $P_{out,max}$ --, therefor.

In Column 8, Line 33, delete "Z," and insert -- $Z_c$ --, therefor.

In Column 9, Line 19, delete "$I_{max,m}$," and insert -- $I_{max,m}$ --, therefor.

In Column 9, Line 31, delete "$V_{ds,m}$," and insert -- $V_{ds,m}$ --, therefor.

In Column 10, Line 8, delete "Z," and insert -- $Z_c$ --, therefor.

In Column 10, Line 59, delete "(Latterally" and insert -- (Laterally --, therefor.

In Column 11, Line 61, delete "and 0" and insert -- and θ --, therefor.

In Column 12, Line 11, delete "$V_{ds,m}$," and insert -- $V_{ds,m}$ --, therefor.

In Column 12, Line 23, delete "Vds,m," and insert -- Vds,m --, therefor.

Signed and Sealed this
Sixteenth Day of August, 2016

Michelle K. Lee
*Director of the United States Patent and Trademark Office*

CERTIFICATE OF CORRECTION (continued)
U.S. Pat. No. 9,019,015 B2

$$\theta = \arccos\left(\frac{-k(I_m - x_b)\cos(\Phi_{f_0} f)}{I_m}\right),$$

In Column 12, Lines 41-43, delete "$x_b < \overline{I_m} \le 1$" and insert -- $\theta = \arccos\left(\frac{-k(\overline{I_m} - x_b)\cos(\Phi_{f_0}\bar{f})}{\overline{I_m}}\right), \quad x_b < \overline{I_m} \le 1$ --, therefor.

In Column 13, Line 58, delete "Vds,m," and insert -- Vds,m --, therefor.

In Column 13, Line 62, delete "Vds,m," and insert -- Vds,m --, therefor.

In Column 15, Line 19, delete "PFEP)" and insert -- PFEP, --, therefor.

In Column 15, Line 47, delete "Z." and insert -- Zc. --, therefor.

In Column 15, Line 61, delete "Vds,m," and insert -- Vds,m --, therefor.

Claims

In Column 17, Line 10, in Claim 1, delete "$V_{ds,c}$;" and insert -- $V_{ds,a}$; --, therefor.

In Column 17, Line 20, in Claim 1, delete "$P_{outmax}$, $P_{outmax}$" and insert -- $P_{out,max}$, $P_{out,max}$ --, therefor.

In Column 18, Line 24, in Claim 9, delete "$1U^{PEP/20}$;" and insert -- $10^{PEP/20}$; --, therefor.

In Column 18, Line 26, in Claim 9, delete "and $x_b$" and insert -- and $x_b$, --, therefor.

In Column 18, Line 47, in Claim 11, delete "to $V_{ds,s}$" and insert -- $V_{ds,a}$ --, therefor.

In Column 18, Line 67, in Claim 11, delete "$P_{outmax}$;" and insert -- $P_{out,max}$; --, therefor.

In Column 19, Line 1, in Claim 11, delete "wherein $P_{outmax}$" and insert -- wherein $P_{out,max}$ --, therefor.

In Column 20, Line 9, in Claim 14, delete "$I_{max/m}$" and insert -- $I_{max,m}$ --, therefor.